(12) United States Patent
Aschenbrenner et al.

(10) Patent No.: US 6,407,457 B1
(45) Date of Patent: Jun. 18, 2002

(54) CONTACT-BUMPLESS CHIP CONTACTING METHOD AND AN ELECTRONIC CIRCUIT PRODUCED BY SAID METHOD

(75) Inventors: Rolf Aschenbrenner, Berlin; Elke Zakel, Falkensee; Hans-Hermann Oppermann; Ghassem Azdasht, both of Berlin, all of (DE)

(73) Assignee: Smart Pac GmbH - Technology Services, Nauen (DE)

( * ) Notice: Subject to any disclaimer, the term of this patent is extended or adjusted under 35 U.S.C. 154(b) by 0 days.

(21) Appl. No.: 09/704,131

(22) Filed: Nov. 1, 2000

Related U.S. Application Data

(60) Continuation-in-part of application No. 09/225,403, filed on Jan. 5, 1999, now abandoned, which is a division of application No. 09/011,570, filed on May 18, 1998, now Pat. No. 6,107,118.

(51) Int. Cl.[7] .............................................. H01L 23/48
(52) U.S. Cl. ........................ 257/777; 257/778; 257/779; 257/783; 257/786
(58) Field of Search ................................ 257/777, 778, 257/779, 783, 786

(56) References Cited

U.S. PATENT DOCUMENTS 5,338,391 A * 8/1994 Suppelsa et al. ............ 156/630
5,363,277 A * 11/1994 Tanaka ....................... 361/760

* cited by examiner

*Primary Examiner*—Eddie Lee
*Assistant Examiner*—Matthew E. Warren
(74) *Attorney, Agent, or Firm*—Dougherty & Clements, LLP

(57) ABSTRACT

An electronic contacting method for contacting a chip having a plurality of conductive contact areas, which are not provided with an additional metallization layer, a carrier substrate is provided, which has a first surface having arranged thereon a plurality of conductive connecting sections. A non-conductive adhesive layer is arranged on the first surface of the carrier substrate and subsequently, the carrier substrate is aligned with a chip to be contacted in such away that a plurality of conductive contact areas on said chip to be contacted is in alignment with the connecting sections on the first surface of said carrier substrate. Then the carrier substrate is connected to the chip to be contacted by means of the adhesive layer in such a way that the connecting sections of the carrier substrate and the contact areas of the chip abut on one another by means of pressure contact, without any intermetallic connection being established.

9 Claims, 2 Drawing Sheets

*a)*

*b)*

CONTACT-BUMPLESS CHIP CONTACTING METHOD AND AN ELECTRONIC CIRCUIT PRODUCED BY SAID METHOD

CROSS REFERENCE TO RELATED APPLICATIONS

This application is a continuation in part of U.S. patent application Ser. No. 09/225,403, filed on Jan. 5, 1999, now abandoned, which is a divisional of U.S. patent application Ser. No. 09/011,570 filed on May 18, 1998 and issued as U.S. Pat. No. 6,107,118 on Aug. 22, 2000.

FIELD OF THE INVENTION

The present invention refers to a chip contacting method and to electronic circuits produced by such a method.

DESCRIPTION OF BACKGROUND ART

In the prior art, chip contacting methods are already known which, in comparison with conventional wire contacting methods, permit a substantial increase in the packaging and connection densities. Examples of such known methods are the TAB method (tape automated bonding= automatic film bonding) and the flip-chip contacting method.

According to these known methods, parasitic electric effects are substantially reduced through shorter signal propagation times with smaller signal losses.

The TAB method is an automatic, simultaneous contacting technique in the case of which the chip is connected via contact bumps to a conducting path structure on e.g. a polyimide film (tape). For fastening the chips provided with the contact bumps to the tape (this being also referred to as "inner-lead bonding"), the contact bumps and the conducting paths are interconnected by a thermode having a defined temperature-pressure-time profile (this being also referred to as thermocompression bonding "TC").

According to the flip-chip contacting method, a chip, which comprises e.g. an integrated circuit, is fastened to the substrate with the active side thereof (referred to as "face down"). Also in this case, the electric connection is established by metallic contact bumps, which can be provided on the chip or, in some cases, also on the substrate.

The disadvantage of the processes which have been described hereinbefore and which use contact bumps (so-called "bumping processes") is to be seen in the fact that these processes require an expensive equipment for the photolithography, the thin film metallization and the electroplating processes, an economic rise of this equipment being only guaranteed when adequately high numbers of pieces are produced.

A further known method is described in U.S. Pat. No. 4,842,662, where the problem arising in connection with the bumping processes is eliminated by a TAB method which does not make use of contact bumps (a "bumpless" TAB method). For this purpose, a conducting path structure is bonded e.g. directly onto an aluminum connection surface of a chip by so-called thermocompression. This method is disadvantageous insofar as thermocompression bonding entails high temperatures and high stresses, which are produced by the compressive force of approx. 50 N/mm² applied during the bonding process. This causes stress on the underlying layer system, which may result in cracks and a failure of components.

JP 60-262 430 A refers to a method of producing a semiconductor element. As can be seen from FIG. 1, a chip is there connected to a carrier substrate. The carrier substrate comprises conducting paths with which the chip to be contacted is to be connected. For producing the connection, this publication teaches the use of a resin, which establishes a connection between the chip and the carrier substrate when the chip has been applied. Contact bumps are provided, which are arranged on the contact area of the chip. In other words, it is necessary to carry out the above-mentioned steps for forming the contact bumps and this results in the problems mentioned hereinbefore.

EP 03 89 040 A1 concerns a substrate with connection structures. According to FIG. 2, a substrate is fastened to a carrier body, the fastening being carried out by means of an adhesive. For establishing the electric connection, contact bumps are provided between the substrate and the carrier body.

SUMMARY OF THE INVENTION

It is the object of the present invention to provide a chip contacting method which permits contacting at low temperatures and under low pressure in a simple, fast and economy priced manner; additional method steps for producing contact bumps or an additional metallization layer on the chip are to be avoided by said method.

The present invention provides a chip contacting method for contacting a chip with a carrier substrate, the chip comprising a plurality of conductive areas and the carrier substrate comprising a plurality of conductive connecting sections, neither the conductive areas nor the conductive connecting sections being provided with an additional metallization layer. The method has the following steps: a) providing a carrier substrate, the first surface of the carrier substrate having arranged thereon a non-conductive adhesive layer; b) aligning the carrier substrate with a chip to be contacted in such a way that the plurality of conductive areas on the chip to be contacted is in alignment with the conductive connecting sections on the first surface of the carrier substrate; and c) connecting the carrier substrate and the chip to be contacted by means of adhesive layer in such a way that the connecting sections of the carrier substrate and the conductive areas of the chip abut on one another by means of pressure contact, without any intermetallic connection being established.

It is a further object of the present invention to provide an electronic circuit in the case of which one chip or a plurality of chips with a plurality of conductive contact areas, which are not provided with an additional metallization layer, are contacted on a carrier substrate in a simple, fast and economy-priced manner.

The present invention provides an electronic circuit, comprising a chip with a plurality of conductive areas which are not provided with an additional metallization layer and a carrier substrate whose first surface, which faces said plurality of conductive areas of the chip, has arranged thereon a non-conductive adhesive layer and a plurality of conductive connecting sections, which are not provided with an additional metallization layer, said adhesive layer covering said plurality of conductive connecting sections at least partially, the conductive connecting sections of the carrier substrate and the conductive areas of the chip abutting on one another by means of pressure contact due to the adhesive force produced by the adhesive layer, without any intermetallic connection being established. The conductive areas are substantially planar with the chip.

One advantage of the method according to the present invention is to be seen in the fact that, due to the use of adhesive processes for the fastening of chips to the carrier substrate, fluxless chip contacting at low temperatures is made possible, said fluxless chip contacting being adapted to be used for flexible substrates with a low glass transition temperature.

A further advantage of the method according to the present invention is to be seen in the fact that the adhesive technology according to the present invention permits the use of a plurality of economy-priced materials, such as polyester, for the substrate.

In comparison with the flip-chip contacting method described hereinbefore, the method according to the present invention shows the further advantage that no contact bumps are required for contacting.

In comparison with the TAB contacting method described hereinbefore, the method according to the present invention offers the advantage that the temperatures and pressures required for carrying out the contacting are much lower.

BRIEF DESCRIPTION OF THE DRAWINGS

In the following, preferred embodiments of the present invention will be explained in detail making reference to the drawings enclosed.

DESCRIPTION OF THE PREFERRED EMBODIMENTS

Figure 1:
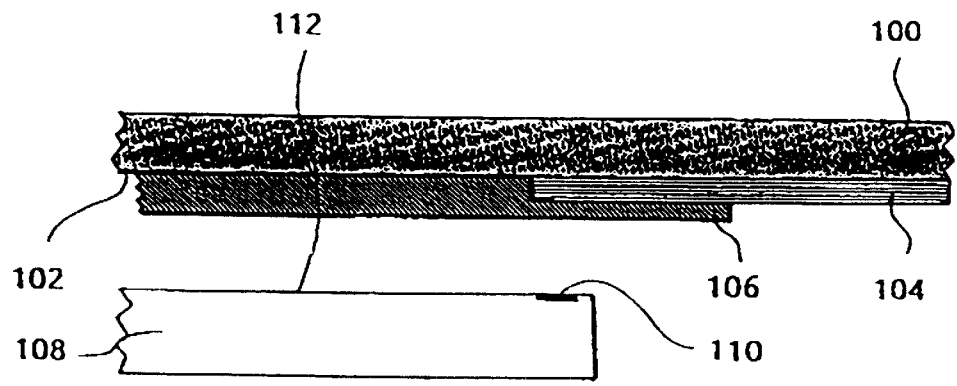
FIG. 1a and FIG. 1b show steps of the method of producing an electronic circuit according to one embodiment of the present invention.
Figure 1:
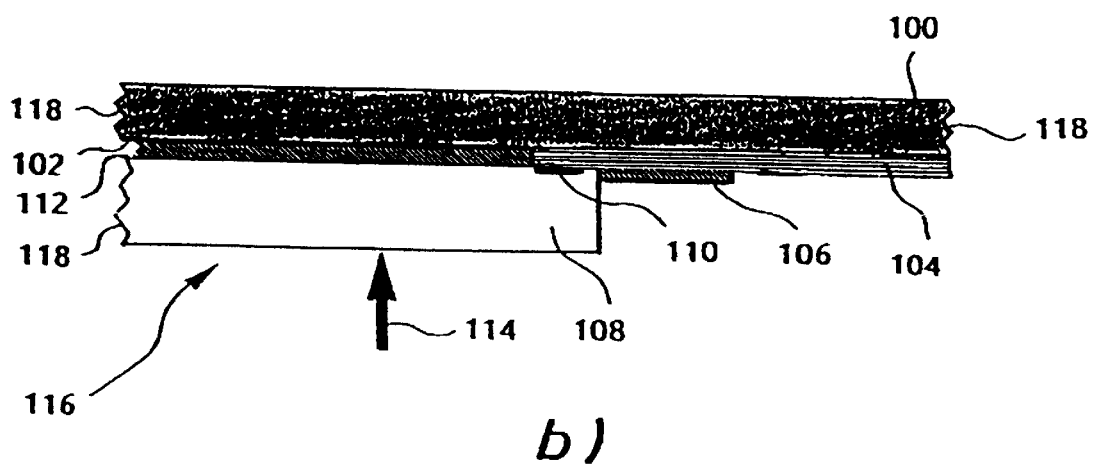

On the basis of FIG. 1, the chip contacting method according to the present invention will be described in detail hereinbelow.

In a first step, a carrier substrate 100 is provided. A surface 102 of said carrier substrate has arranged thereon a plurality of conductive connecting sections 104 which are not provided with an additional metallization layer. The first surface 102 of the carrier substrate 100 has additionally arranged thereon a non-conductive adhesive layer 106.

In a second step, which is shown in FIG. 1a, the carrier substrate 100 is brought into alignment with a chip 108 to be contacted. This alignment is carried out such that a plurality of conductive contact areas 110, which are arranged on a surface 112 of the chip 108, is in alignment with the connecting sections 104 on the first surface 102 of the carrier substrate 100. The conductive contact areas 110 are pads as generated during manufacturing of the chip 108 and, therefore are substantially planar with the surface of the chip 108. By substantially planar it is meant that the contact areas 110 are either planar with or slightly recessed into the chip 108. Hence, the contact areas 110 are not formed via an additional step in which conductive material is added to the contact areas 110 to extend the contact areas 110 from the chip 108 to create a "bump" and, consequently, the contact areas 110 are not projection electrodes. Preferably, the contact areas 110 deviate from the surface of the chip 108 by 3 µm or less, and more preferably by 1 µm or less.

In a third step, which is shown in FIG. 1b, the carrier substrate 100 and the chip 108 to be contacted are connected by means of the adhesive layer 106 under a predetermined pressure and at a predetermined temperature so that the connecting sections 104 of the carrier substrate 100 and the contact areas 110 of the chip 108 abut on one another.

Reference is made to the fact that, in the embodiment shown in FIG. 1, the carrier substrate 100 is made from a flexible material.

The carrier substrate 100 can consist of polyester or polyimide.

In the embodiment shown in FIG. 1, the connecting sections 104 are produced from copper and gold-plated. It is apparent that also other conductive materials are suitable for producing the connecting sections 104; said connecting sections 104 are preferably provided with a plastically deformable metal layer or they consist of a plastically deformable metal layer. The plastically deformable metal layer can be a gold layer. Said plastically deformable metal layer may, however, also consist of a tin layer.

The contact areas 110 on the chip 108 are produced from aluminum in the case of the embodiment shown in FIG. 1. It is, however, possible to use also other suitable conductive materials for producing the contact areas 110.

According to a preferred embodiment of the present invention, the adhesive layer 106 is implemented as an adhesive film.

In accordance with a further embodiment of the present invention, the adhesive layer consists of a thermosetting adhesive.

As can be seen in FIG. 1, the adhesive layer 106 of this embodiment covers the connecting sections 104 at least partially. In the case of other embodiments, this is not necessary, i.e. the adhesive layer 106 does not cover the connecting sections 104.

In the following, the third step of the method according to the present invention will be described in detail on the basis of FIG. 1b. When the carrier substrate 100 has been brought into alignment with the chip 108 to be contacted, said carrier substrate 100 is arranged on said chip 108 to be contacted in a first substep. Subsequently, the chip 108 has applied thereto a predetermined pressure; this pressure being represented by arrow 114. Following this, a predetermined temperature is applied so as to activate the adhesive layer 106. This activation of the adhesive layer permits the contact area 110 of the chip 108 to abut on the connecting section 104. When the adhesive layer 106 has been activated, the predetermined pressure is maintained until the adhesive layer 106 has been cured so as to guarantee that the connecting section 104 does not become detached from the contact area 108 while the adhesive layer 106 is being cured.

The predetermined pressure is not removed from the chip until the adhesive layer 106 has been fully cured.

In other words, the method according to the present invention is based on a non-conductive, thermosetting adhesive film in the case of which a contact-bumpless chip 108 is connected to a substrate 100 at a predetermined temperature, which suffices to activate the thermosetting adhesive film, and under a predetermined pressure. The pressure is chosen such that the connecting sections of the carrier substrate and the contact areas of the chip abut on one another by means of pressure contact, without any intermetallic connection being established, such intermetallic connections resulting e.g. from joining, soldering or welding processes.

The pressure applied is maintained until the chip 108 has been fixed due to curing of the adhesive 106, which means that the chip 108 is conductively connected to the carrier substrate 100.

Reference is made to the fact that the electric contact according to the present invention is not based on metallic welding between the conducting path 104 and the bonding pad metallization 110, but that the electric contact is established by pressure contact alone, said pressure contact being maintained by the adhesive force of the adhesive layer 106.

As has already been mentioned, a film strip of polyimide can be used as a carrier substrate 100, as in the case of TAB bonding, the copper connecting leads 104 of said film strip being gold-plated. The metallization on the bonding pads 110 of the chip 108 normally consists of aluminum.

According to a further preferred embodiment, gold is bonded onto aluminum in accordance with the method described hereinbefore; for the bonding process, the aluminum bonding pads are first adjusted on the chip 108 over the conducting paths 104 and, subsequently, a flip-chip bonder having a defined temperature-pressure-time profile is lowered onto the connecting leads 104 so as to enable simultaneous contacting of all connections, i.e. a simultaneous connection of all contact areas of the chip 108 with the connecting sections 104.

As has already been mentioned, the method according to the present invention is carried out at temperatures and pressures which are much lower than those used in conventional bonding methods.

For example, the pressure applied to the chip preferably lies in the range of 0.5 N/mm$^2$ to 2.5 N/mm$^2$, and the temperature applied preferably lies in the range of 100° C. to 200° C.

On the basis of FIG. 1b, an electronic circuit according to the present invention will be described in detail hereinbelow.

The circuit according to the present invention is designated generally by reference numeral 116.

As can be seen from the broken edges 118, FIG. 1b only shows part of a larger electronic circuit.

The electronic circuit 116 according to the present invention comprises one or a plurality of chips 108 provided with conductive contact areas 110. Furthermore, the electronic circuit 116 comprises a carrier substrate 100, the first surface 102 of said carrier substrate 100, which faces the contact areas 110 of the chip or chips 108, having arranged thereon a non-conductive adhesive layer 106 and a plurality of conductive connecting sections 104, said adhesive layer covering said plurality of connecting sections 104 at least partially. The contact areas 110 of the chip or chips 108 and the connecting sections 104 of the carrier substrate 100 are arranged in electric contact with one another due to the adhesive force applied by the adhesive layer. Reference is made to the fact that, as has already been described, this electric contact does not consist of a metallic weld between the contact areas 110 and the connecting sections 104, but that it is a mere pressure contact which is maintained by the adhesive force.

On the basis of FIG. 2, a carrier substrate according to the present invention will be described in detail hereinbelow.

Figure 2:
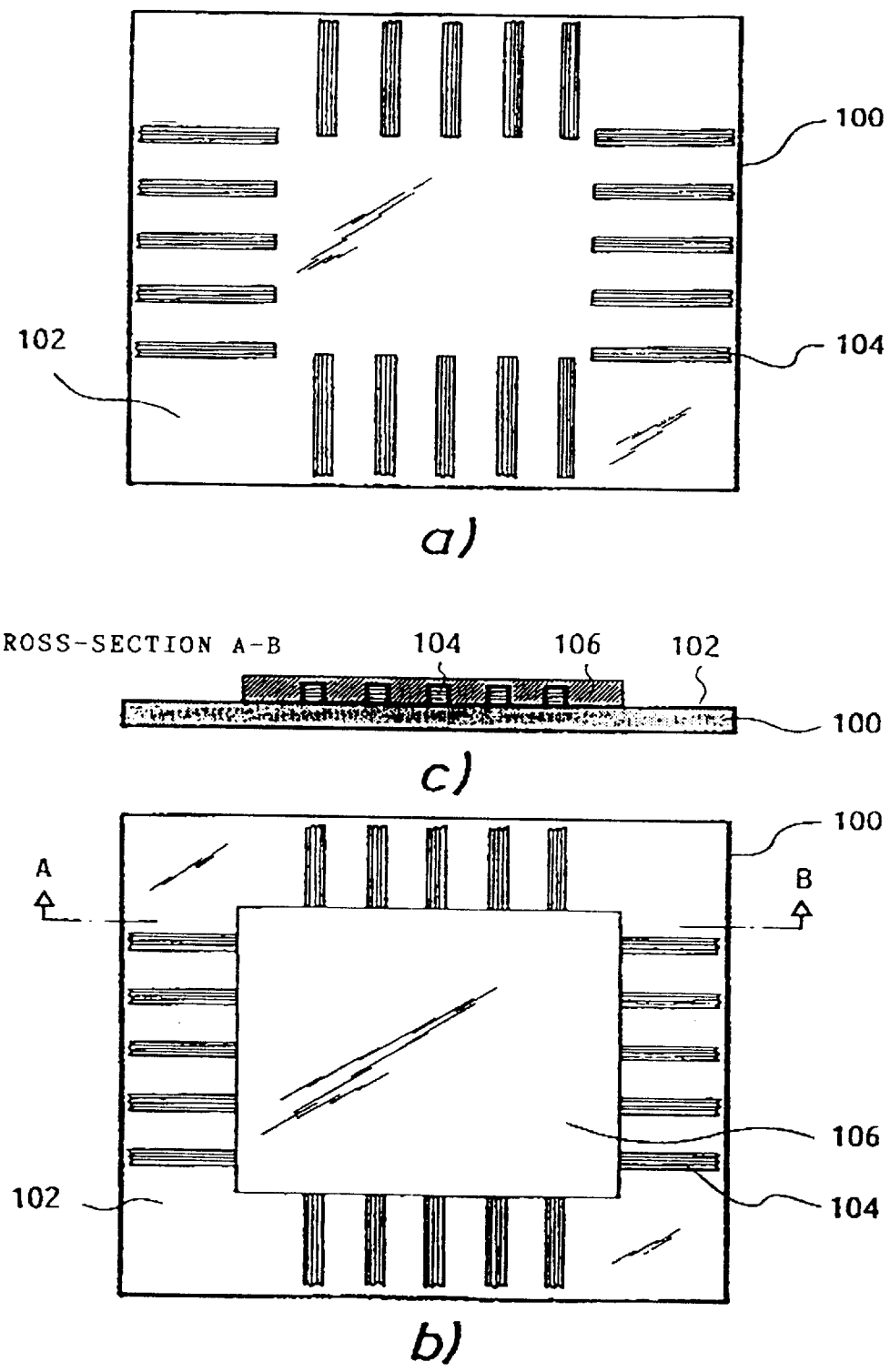
FIGS. 2a to 2c show representations of the carrier substrate used for contacting chips according to the present invention.

It is pointed out that elements in FIG. 2 which correspond to elements in FIG. 1 have been designated by identical reference numerals.

In FIG. 2a, a carrier substrate 100 is shown, said carrier substrate 100 having a first surface 102 on which a plurality of connecting sections 104 is arranged in accordance with a predetermined structure.

Reference is made to the fact that the carrier substrate described on the basis of FIG. 2 can consist of the same materials as the carrier substrate described on the basis of FIG. 1 and that it can also have the same properties as said carrier substrate according to FIG. 1.

In FIG. 2b, the carrier substrate 100 is shown with the connecting sections 104, an adhesive layer 106 being arranged on the first surface 102 in such a way that the connecting sections 104 are covered at least partially by said adhesive layer 106.

Reference is made to the fact that the partial covering of the connecting sections 104 by the adhesive layer is not a feature which is absolutely necessary. The adhesive layer 106 can be a thermosetting adhesive layer.

It should also be noted that on the carrier substrate for contacting chips according to the present invention the structure of the connecting sections 104 has been selected such that these connecting sections can easily be contacted with a structure of contact areas on a chip to be contacted.

In FIG. 2c, a section along line A–B in FIG. 2b is shown. As can be seen in this figure, the adhesive layer 106 covers the connecting sections 104 partially.

The present invention is not limited to the use of the materials described for producing the carrier substrate 100. The method according to the present invention permits especially also the use of economy-priced materials for the carrier substrate.

What is claimed is:

1. An electronic circuit, comprising:

a chip, said chip having a plurality of conductive areas, said conductive areas planar with a surface of said chip, said conductive areas having no additional metallization layers, thus forming a contact-bumpless chip; and a carrier substrate, said substrate having a plurality of conductive connections, said conductive connections having no additional metallization layers and having an insulating adhesive layer, said substrate facing said conductive areas of said chip such that at least one conductive area of said chip abuts at least one conductive connection of said substrate when the chip and substrate are joined by pressure contact.

2. An electronic circuit, comprising:

a chip with a plurality of conductive areas which are planar with a surface of said chip, and said conductive areas are not provided with an additional metallization layer, thus forming a contact-bumpless chip; and a carrier substrate whose first surface, which faces said plurality of conductive areas of the chip, has arranged thereon a non-conductive adhesive layer and a plurality of conductive connecting sections, which are not provided with an additional metallization layer, said adhesive layer covering said plurality of conductive connecting sections at least partially, the conductive connecting sections of the carrier substrate and the conductive areas of the chip abutting on one another by means of pressure contact due to the adhesive force produced by the adhesive layer without any intermetallic connection being established.

3. The electronic circuit of claim 2 wherein the carrier substrate is flexible.

4. An electronic circuit, comprising:

a chip, said chip having a plurality of conductive areas, said conductive areas are recessed into said chip, said conductive areas having no additional metallization layers, thus forming a contact-bumpless chip; and a carrier substrate, said substrate having a plurality of conductive connections, said conductive connections having no additional metallization layers and having an insulating adhesive layer, said substrate facing said conductive areas of said chip such that at least one conductive area of said chip abuts at least one conductive connection of said substrate when the chip and substrate are joined by pressure contact.

5. The electronic circuit of claim 4 wherein the conductive areas deviate from the surface of said chip by 3 μm or less.

6. The electronic circuit of claim 4 wherein the conductive areas deviate from the surface of said chip by 1 μm or less.

7. An electronic circuit, comprising;
a chip with a plurality of conductive areas which are recessed into said chip, and said conductive areas are not provided with an additional metallization layer, thus forming a contact-bumpless chip; and
a carrier substrate whose first surface, which faces said plurality of conductive areas of the chip, has arranged thereon a non-conductive adhesive layer and a plurality of conductive connection sections, which are not provided with an additional metallization layer, said adhesive layer covering said plurality of conductive connecting sections at least partially, the conductive connecting sections of the carrier substrate and the conductive areas of the chip abutting on one another by means of pressure contact due to the adhesive force produced by the adhesive layer, without any intermetallic connection being established.

8. The electronic circuit of claim 7 wherein the conductive areas deviate from the surface of said chip by 3 μm or less.

9. The electronic circuit of claim 7 wherein the conductive areas deviate from the surface of said chip by 1 μm or less.

* * * * *